(12) United States Patent
Uetake

(10) Patent No.: US 7,099,225 B2
(45) Date of Patent: Aug. 29, 2006

(54) SEMICONDUCTOR MEMORY DEVICE WITH REDUCED LEAK CURRENT

(75) Inventor: Toshiyuki Uetake, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/019,386

(22) Filed: Dec. 23, 2004

(65) Prior Publication Data

US 2006/0050595 A1    Mar. 9, 2006

(30) Foreign Application Priority Data

Sep. 6, 2004   (JP) .............................. 2004-258905

(51) Int. Cl.
*G11C 8/08*   (2006.01)

(52) U.S. Cl. .................. 365/229; 365/230.06

(58) Field of Classification Search ..................... None
See application file for complete search history.

(56) References Cited

U.S. PATENT DOCUMENTS 5,703,825 A * 12/1997 Akiba et al. ................ 365/229
5,712,823 A * 1/1998 Gillingham ................. 365/203
5,717,650 A * 2/1998 Chung et al. .......... 365/230.06
5,914,905 A * 6/1999 Hikichi et al. .............. 365/229
6,414,363 B1   7/2002 Mizuguchi .................. 257/394

FOREIGN PATENT DOCUMENTS

| JP | 410031889 A | * | 2/1998 |
| JP | 10-275465 | | 10/1998 |
| JP | 410275465 A | * | 10/1998 |
| JP | 2001-143477 | | 5/2001 |

* cited by examiner

*Primary Examiner*—Tan T. Nguyen
(74) *Attorney, Agent, or Firm*—Arent Fox PLLC

(57) ABSTRACT

A semiconductor memory device includes a memory cell array, a decoder circuit configured to assert a decoding signal for selecting an access position in the memory cell array in response to an address signal supplied from an exterior, and a first circuit configured to put the decoding signal of the decoder circuit in an asserted state regardless of a value of the address signal in response to assertion of a standby signal supplied from the exterior.

9 Claims, 7 Drawing Sheets

SEMICONDUCTOR MEMORY DEVICE WITH REDUCED LEAK CURRENT

CROSS-REFERENCE TO RELATED APPLICATIONS

The present application is based upon and claims the benefit of priority from the prior Japanese Patent Application No. 2004-258905 filed on Sep. 6, 2004, with the Japanese Patent Office, the entire contents of which are incorporated herein by reference.

BACKGROUND OF THE INVENTION

1. Field of the Invention

The present invention generally relates to semiconductor memory devices, and particularly relates to a semiconductor memory device provided with a decoder circuit for selectively activating a selection line in response to an address signal.

2. Description of the Related Art

In semiconductor memory devices such as SRAMs (static random access memories) and DRAMs (dynamic random access memories), a plurality of memory cells are arranged in matrix form having rows and columns to form a cell array, with each memory cell storing data therein. At the time of read operation and write operation, access is made to a memory cell positioned at the row address and column address specified by an address signal.

In read operation, the address signal is decoded, followed by selectively activating a word line corresponding to the row address selected by the decoding result. Among the plurality of memory cells of the cell array, memory cells connected to the selectively activated word line provide their data to complementary bit lines. A voltage difference generated between the complementary bit lines responsive to the read data is amplified by sense amplifiers. Among the data amplified by the sense amplifiers, data corresponding to the column address selected by the decoding result of the address signal is output to the exterior of the semiconductor memory device as read data. In write operation, data is written from the exterior to the sense amplifier corresponding to a specified column address. Thereafter, the data stored in the sense amplifier is stored in the memory cell connected to a selectively activated word line.

FIG. 1 is a circuit diagram showing the configuration of the last stage of a related-art decoder circuit. The circuit of FIG. 1 includes a NAND circuit 11, PMOS transistors 12-1 through 12-3, and NMOS transistors 13-1 through 13-3. The NAND circuit 11 is the last stage of the decoder circuit that decodes an address signal, and corresponds to a single address. Namely, the selection of a particular address by an address signal results in the output of the NAND circuit 11 being LOW. The PMOS transistor 12-1 and the NMOS transistor 13-1 constitute a first-stage inverter, the PMOS transistor 12-2 and the NMOS transistor 13-2 constituting a second-stage inverter, and the PMOS transistor 12-3 and the NMOS transistor 13-3 constituting a third-stage inverter. The drive power of the transistors is progressively increased from the first inverter to the third inverter. This makes it possible to drive an output signal serving as a word selection signal or column selection signal with a large drive power at high speed.

Conventionally, the transistors that are selected in the output portion of the decoder circuit are implemented by use of transistors having a small threshold value in order to achieve a faster access time. Here, the selected transistors are the transistors that become conductive at the time of selecting the specified address. In the example shown in FIG. 1, the word selection signal (or column selection signal) is set to HIGH and put in a selected state when the output of the NAND circuit 11 is LOW. It thus follows that the PMOS transistor 12-1, the NMOS transistor 13-2, and the PMOS transistor 12-3 are the selected transistors.

In this manner, the transistors that are selected in the output portion of the decoder circuit are implemented by use of transistors having a small threshold value. This shortens a signal delay from the output of the NAND circuit 11 to the word selection signal (or column selection signal), thereby making it possible to drive the selection signal at high speed.

[Patent Document 1] Japanese Patent Application Publication No. 2001-143477

[Patent Document 2] Japanese Patent Application Publication No. 10-275465

In the configuration as described above, the transistors having a small threshold value are turns off at the time of standby (at the time of an unselected state). Unfortunately, transistors having a small threshold value have a problem in that a leak current is large. Namely, a large leak current flows at the time of standby (at the time of an unselected state), resulting in excessive power consumption.

In order to obviate this problem, a transistor having a large threshold value may be inserted between the power supply potential and the source node of the transistors having a small threshold value, and may be turned off to shut off the leak current at the time of standby (at the time of an unselected state). Such configuration, however, requires that the transistor having a large threshold value be made in a large size for the purpose of achieving high-speed operations. This is not preferable as it results in an increase in chip size.

Accordingly, there is a need for a semiconductor memory device which can reduce a leak current in the decoder circuit at the time of an unselected state.

SUMMARY OF THE INVENTION

It is a general object of the present invention to provide a semiconductor memory device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages in accordance with the purpose of the invention, the invention provides a semiconductor memory device, which includes a memory cell array, a decoder circuit configured to assert a decoding signal for selecting an access position in the memory cell array in response to an address signal supplied from an exterior, and a first circuit configured to put the decoding signal of the decoder circuit in an asserted state regardless of a value of the address signal in response to assertion of a standby signal supplied from the exterior.

According to another aspect of the present invention, the semiconductor memory device further includes a second circuit configured to activate a selection line corresponding to the access position in the memory cell array in response to assertion of the decoding signal of the decoder circuit if the standby signal is negated, and configured to deactivate the selection line regardless of a value of the decoding signal of the decoder circuit in response to the assertion of the standby signal.

According to at least one embodiment of the invention, when the semiconductor memory device is put in a standby state, the first circuit as described above puts the decoding signal of the decoder circuit in an asserted condition (i.e., the state in which the corresponding address is selected) without an exception. This makes it possible to turn off the transistors having a large threshold value among the transistors constituting the decoder circuit, thereby preventing the flow of a large leak current.

According to at least one embodiment of the invention, the second circuit forcibly puts the address selection line in a deactivated state if the standby signal indicates a standby state (i.e., unselected state). This provision makes it possible to prevent the destruction of data in memory cells.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 1:
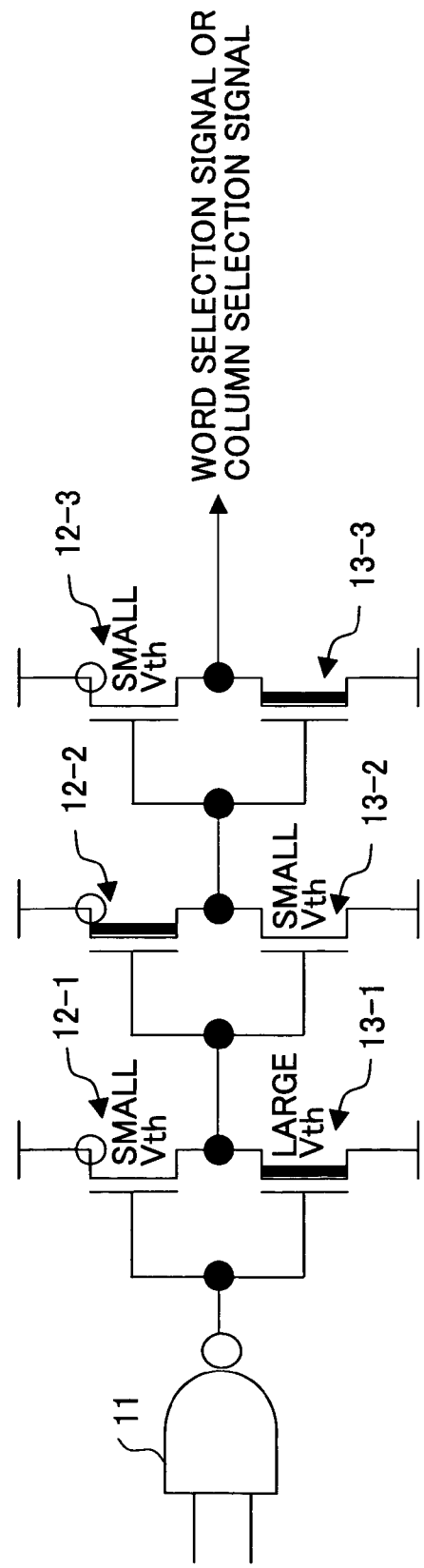
FIG. 1 is a circuit diagram showing the configuration of the last stage of a related-art decoder circuit.
Figure 2:
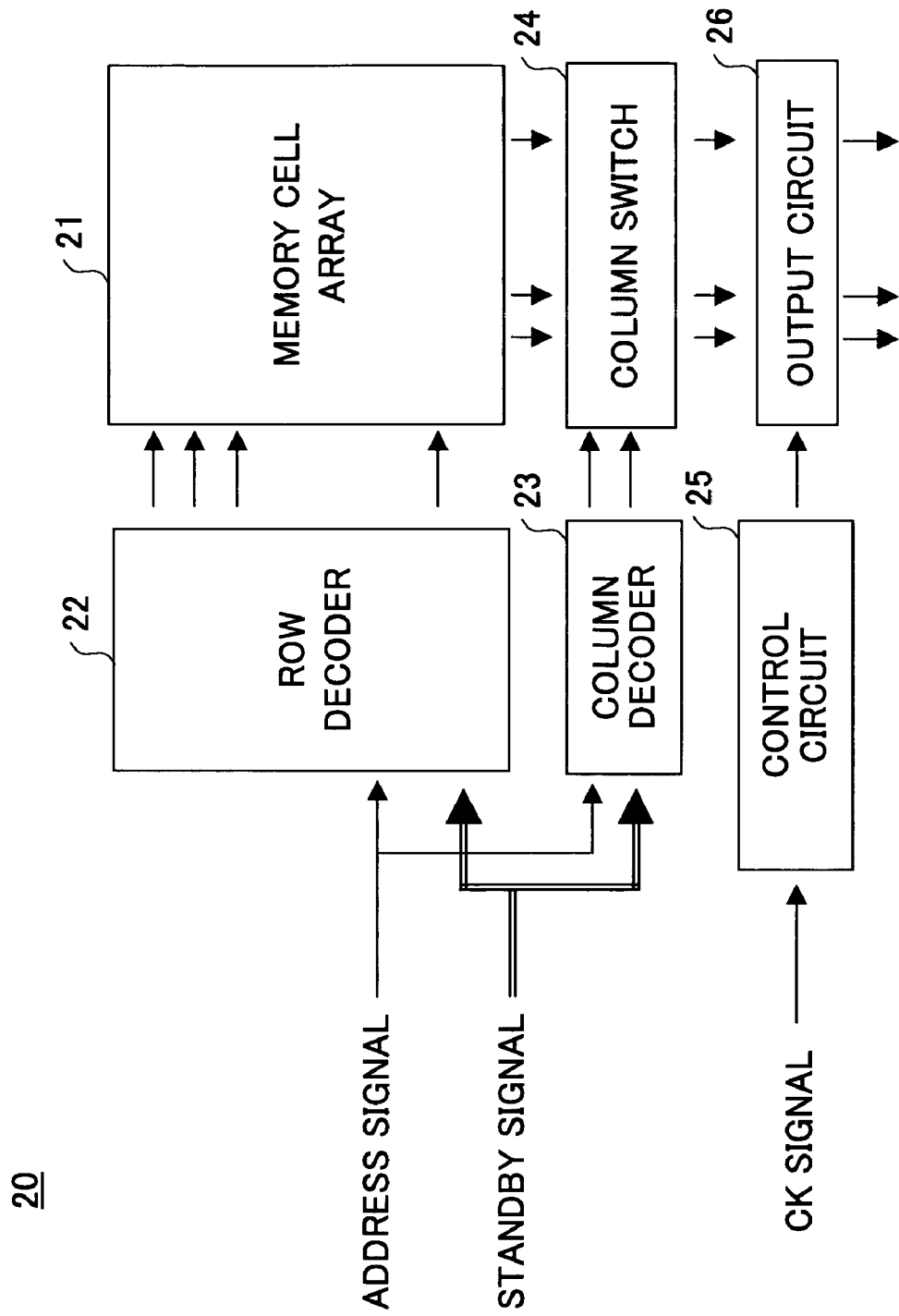
FIG. 2 is a block diagram showing an example of the configuration of a semiconductor memory device to which the present invention is applied.

FIG. 2 is a block diagram showing an example of the configuration of a semiconductor memory device to which the present invention is applied. A semiconductor memory device 20 shown in FIG. 2 includes a memory cell array 21, a row decoder 22, a column decoder 23, a column switch 24, a control circuit 25, and an output circuit 26.

In the memory cell array 21, a plurality of memory cells are arranged in matrix form having rows and columns to form a cell array, with each memory cell storing data therein. In the memory cell array 21, a plurality of word lines are provided to correspond to respective row addresses, and each word line is connected to a plurality of memory cells. In the direction in which column addresses are lined up, a plurality of bit lines are lined up, each of which is connected to a sense amplifier.

The row decoder 22 decodes an address signal supplied from the exterior, and selectively activates a word line corresponding to the specified row address. The column decoder 23 decodes an address signal supplied from the exterior, and selectively activates a column selection line corresponding to the specified column address. The column switch 24 couples the sense amplifier corresponding to the selectively activated column selection line to the output circuit 26. The control circuit 25 operates in synchronization with a clock signal CK, and outputs the read data to the exterior of the semiconductor memory device 20 as the data is supplied from the memory cell array 21 through the column switch 24.

In read operation, the address signal is decoded, followed by selectively activating a word line corresponding to the row address selected by the decoding result. Among the plurality of memory cells of the memory cell array 21, memory cells connected to the selectively activated word line provide their data to complementary bit lines. A voltage difference generated between the complementary bit lines responsive to the read data is amplified by sense amplifiers. Among the data amplified by the sense amplifiers, data corresponding to the column address selected by the decoding result of the address signal is output to the exterior of the semiconductor memory device 20 as read data. In write operation, data is written from the exterior to the sense amplifier corresponding to a specified column address. Thereafter, the data stored in the sense amplifier is stored in the memory cell connected to a selectively activated word line.

The semiconductor memory device 20 receives a standby signal from the exterior. In response to the assertion of the standby signal, the row decoder 22 and the column decoder 23 are put in an unselected state with respect to all the addresses.

Figure 3:
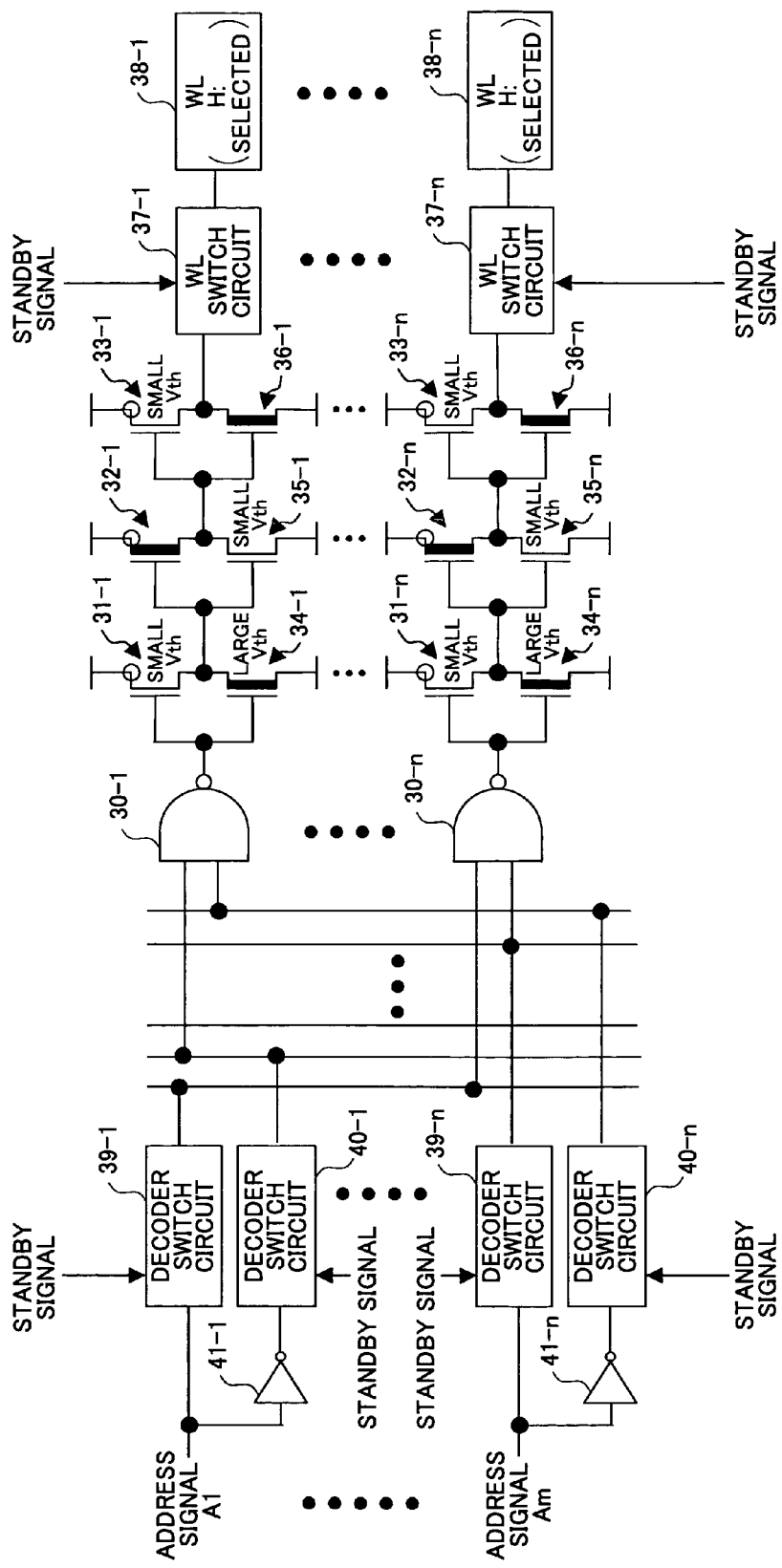
FIG. 3 is a circuit diagram showing an example of the configuration of a row decoder according to an embodiment of the present invention.

FIG. 3 is a circuit diagram showing an example of the configuration of the row decoder 22 according to an embodiment of the present invention. Although FIG. 3 only illustrates the configuration of the row decoder 22, it should be noted that the column decoder 23 is configured in the same manner.

The row decoder 22 of FIG. 3 includes NAND circuits 30-1 through 30-n, PMOS transistors 31-1 through 31-n, PMOS transistors 32-1 through 32-n, PMOS transistors 33-1 through 33-n, NMOS transistors 34-1 through 34-n, NMOS transistors 35-1 through 35-n, NMOS transistors 36-1 through 36-n, WL switch circuits 37-1 through 37-n, decoder switch circuits 39-1 through 39-n, decoder switch circuits 40-1 through 40-n, and inverters 41-1 through 41-n. The row decoder 22 serves to selectively activate one of the n word lines (WL) 38-1 through 38-n by setting it to HIGH. Corresponding to the n word lines, n replicates of each circuit element are provided.

The NAND circuits 30-1 through 30-n constitute the last stage of the decoder circuit that decodes an address signal, and each correspond to a single address. In the example shown in FIG. 3, the output of the NAND circuit 30-1 becomes LOW if both of the address signals A1 and Am are LOW at the same time, resulting in the selective activation of the word line (WL) 38-1. Further, the output of the NAND circuit 30-n becomes LOW if both of the address signals A1 and Am are HIGH at the same time, resulting in the selective activation of the word line (WL) 38-n.

In the circuit portion corresponding to the word line 38-1, the PMOS transistor 31-1 and the NMOS transistor 34-1 constitute a first-stage inverter, the PMOS transistor 32-1 and the NMOS transistor 35-1 constituting a second-stage inverter, and the PMOS transistor 33-1 and the NMOS transistor 36-1 constituting a third-stage inverter. The drive power of the transistors is progressively increased from the first inverter to the third inverter. This makes it possible to drive the word selection signal of the word line 38-1 with a large drive power at high speed.

In the configuration described above, the transistors that are selected in the output portion of the decoder circuit are implemented by use of transistors having a small threshold value in order to achieve a faster access time. Here, the selected transistors are the transistors that become conductive at the time of selecting the specified address. Since the word selection signal of the word line 38-1 is set to HIGH and put in a selected state when the output of the NAND circuit 30-1 is LOW, the PMOS transistor 31-1, the NMOS transistor 35-1, and the PMOS transistor 33-1 are the selected transistors.

The same configurations as the above configuration are provided for respective circuit portions corresponding to the word lines 38-1 through 38-n. Implementing the transistors selected in the output portion of the decoder circuit by use of transistors having a small threshold value as described above makes it possible to reduce a signal delay from the outputs of the NAND circuits 30-1 through 30-n to the word selection signals, thereby driving the selection signals at high speed. The transistors that are not selected are implemented by use of transistors having a large threshold value as illustrated in FIG. 3.

In this embodiment of the present invention, the decoder switch circuits 39-1 through 39-n and the decoder switch circuits 40-1 through 40-n are provided in order to prevent leak currents flowing through the transistors having a small threshold value in the unselected state. The decoder switch circuits 39-1 through 39-n and the decoder switch circuits 40-1 through 40-n each receive a standby signal (or its inversion "/STANDBY SIGNAL"), and set their outputs to HIGH all the time if the standby signal indicates the unselected state. In such a case, thus, all the address decoding results, i.e., all the outputs of the NAND circuits 30-1 through 30-n, are set to LOW. As a result, the transistors having a large threshold value are turned off (become nonconductive) in the first through third inverters provided in the output portion of the decoder circuit, thereby substantially preventing the flow of leak currents. Namely, in the circuit portion corresponding to the word line 38-1, for example, the NMOS transistor 34-1, the PMOS transistor 32-1, and the NMOS transistor 36-1 are turned off, so that the large threshold value of these transistors brings about a substantially complete nonconductive state, thereby preventing the flow of leak currents.

When all the address decoding results (i.e., all the outputs of the NAND circuits 30-1 through 30-n) are set to LOW in the output portion of the decoder circuit, all the word lines 38-1 through 38-n are put in a selectively activated state unless some countermeasure is taken. In the embodiment of the present invention, therefore, the WL switch circuits 37-1 through 37-n are provided to force the word lines 38-1 through 38-n into a deactivated state if the standby signal indicates an unselected state. With this provision, it is possible to forcibly deactivate (i.e., set to LOW) the word lines 38-1 through 38-n if the standby signal selects an unselected state, thereby preventing the destruction of data in the memory cell of the memory cell array 21.

In the embodiment of the present invention as described above, when the semiconductor memory device is put in a standby state, the decoder switch circuits put all the signals indicative of an address decoding result in an asserted state (i.e., the state in which the corresponding address is selected). This turns off the transistors having a large threshold value among the transistors constituting the circuit for driving selection signals in the decoder output portion, thereby preventing the flow of large leak currents. Further, the WL switch circuits force the word lines into a deactivated state so as to prevent data destruction in the memory cells when the standby signal indicates an unselected state. It should be noted that it suffices to provide the decoder switch circuits with respect to the m respective address signals in this configuration. Since m is significantly smaller than n that is the number of signals obtained after address decoding, there is an advantage in that a small number of decoder switch circuits is sufficient.

Figure 4:
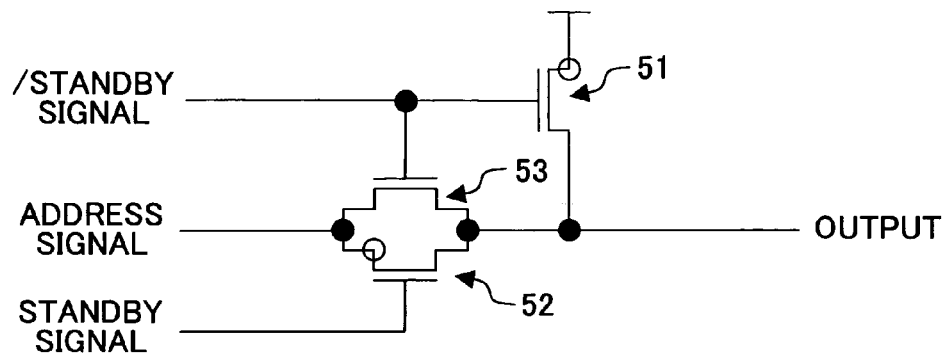
FIG. 4 is a circuit diagram showing a first embodiment of a decoder switch circuit.

FIG. 4 is a circuit diagram showing a first embodiment of a decoder switch circuit. The decoder switch circuit of FIG. 4 includes PMOS transistors 51 and 52 and an NMOS transistor 53.

The PMOS transistor 52 and the NMOS transistor 53 are connected in parallel to constitute a transfer gate. When the standby signal is LOW (i.e., when /STANDBY SIGNAL is HIGH) indicative of a normal read/write operation, the PMOS transistor 51 becomes nonconductive, and the transfer gate allows the passage of an address signal. Accordingly, the decoder circuit performs a normal decoding operation. When the standby signal is HIGH (i.e., when /STANDBY SIGNAL is LOW) indicative of an unselected state corresponding to a standby state, the PMOS transistor 51 becomes conductive, and the transfer gate blocks the address signal. As a result, the output of the decoder switch circuit becomes HIGH, resulting in all the decoding signals output from the decoder circuit being asserted.

Figure 5:
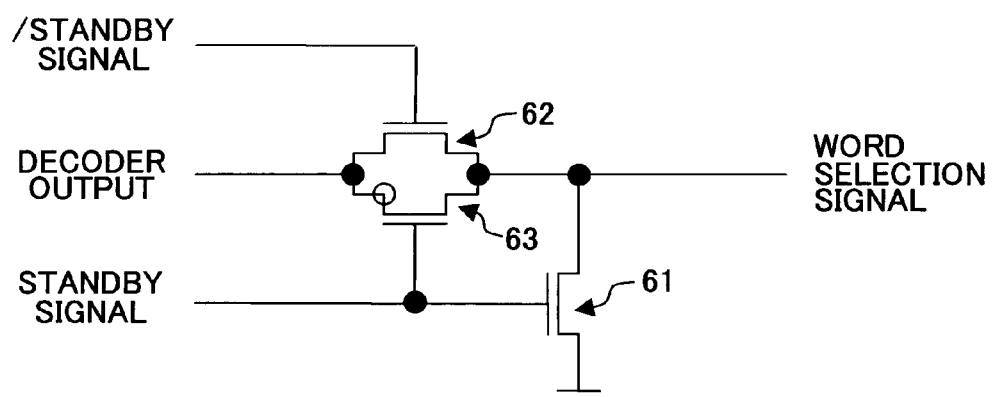
FIG. 5 is a circuit diagram showing a first embodiment of a WL switch circuit.

FIG. 5 is a circuit diagram showing a first embodiment of a WL switch circuit. The WL switch circuit of FIG. 5 includes NMOS transistors 61 and 62 and a PMOS transistor 63.

The NMOS transistor 62 and the PMOS transistor 63 are connected in parallel to constitute a transfer gate. When the standby signal is LOW (i.e., when /STANDBY SIGNAL is HIGH) indicative of a normal read/write operation, the NMOS transistor 61 becomes nonconductive, and the transfer gate allows the passage of a decoder output. Accordingly, an operation for selective activation of a word line is properly performed in response to the word selection line. When the standby signal is HIGH (i.e., when /STANDBY SIGNAL is LOW) indicative of an unselected state corresponding to a standby state, the NMOS transistor 61 becomes conductive, and the transfer gate blocks the decoder output. As a result, the word-line selection signal becomes LOW, resulting in all the word lines being put in a deactivated state to provide a proper standby state.

Figure 6:
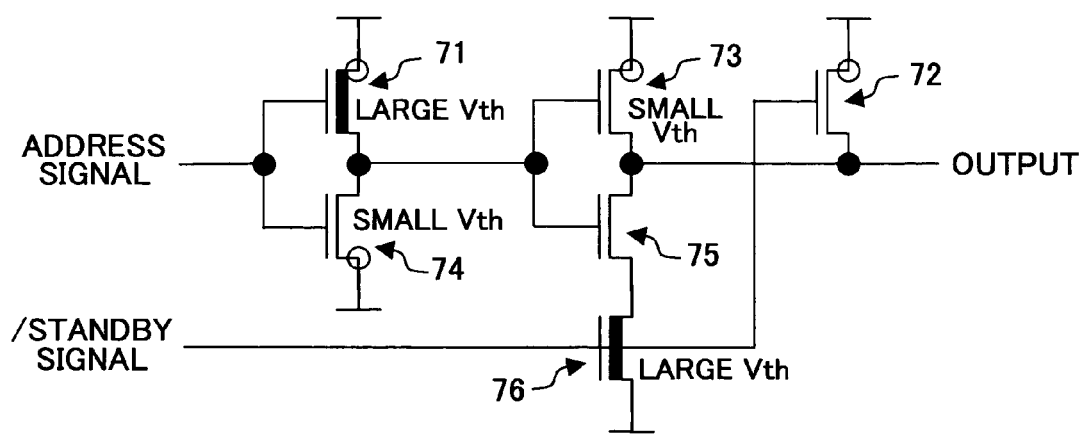
FIG. 6 is a circuit diagram showing a second embodiment of the decoder switch circuit.

FIG. 6 is a circuit diagram showing a second embodiment of the decoder switch circuit. The decoder switch circuit of FIG. 6 includes PMOS transistors 71 through 73 and NMOS transistors 74 through 76.

The PMOS transistor 71 and the NMOS transistor 74 constitute a first-stage inverter, and the PMOS transistor 73 and the NMOS transistor 75 constitute a second-stage inverter. When /STANDBY SIGNAL is HIGH indicating a normal read/write operation, the PMOS transistor 72 becomes nonconductive, and the NMOS transistor 76 becomes conductive. As a result, an address signal passes through the first-stage inverter and the second-stage inverter to be output as it is. The decoder circuit thus performs a normal decoding operation. When /STANDBY SIGNAL is LOW indicating an unselected state corresponding to a standby state, the PMOS transistor 72 becomes conductive, and the NMOS transistor 76 becomes nonconductive. The output of the decoder switch circuit is thus set to HIGH, resulting in all the decoding signals output from the decoder circuit being asserted.

In this configuration, the NMOS transistor 74 and the PMOS transistor 73 are designed to have a small threshold value in order to speed up signal transmission when a HIGH address signal is input. In the case in which a LOW address signal is input, this circuit portion does not affect the outputting of the decoding signal corresponding to the specified address. There is thus no need to take into account the speed of signal transmission. Accordingly, the PMOS transistor 71 which becomes conductive by responding to a LOW address signal is designed to have a large threshold value so as to suppress an excessive leak current. Moreover, the threshold of the NMOS transistor 76 is also set to a large value, thereby to suppress an excessive leak current.

Figure 7:
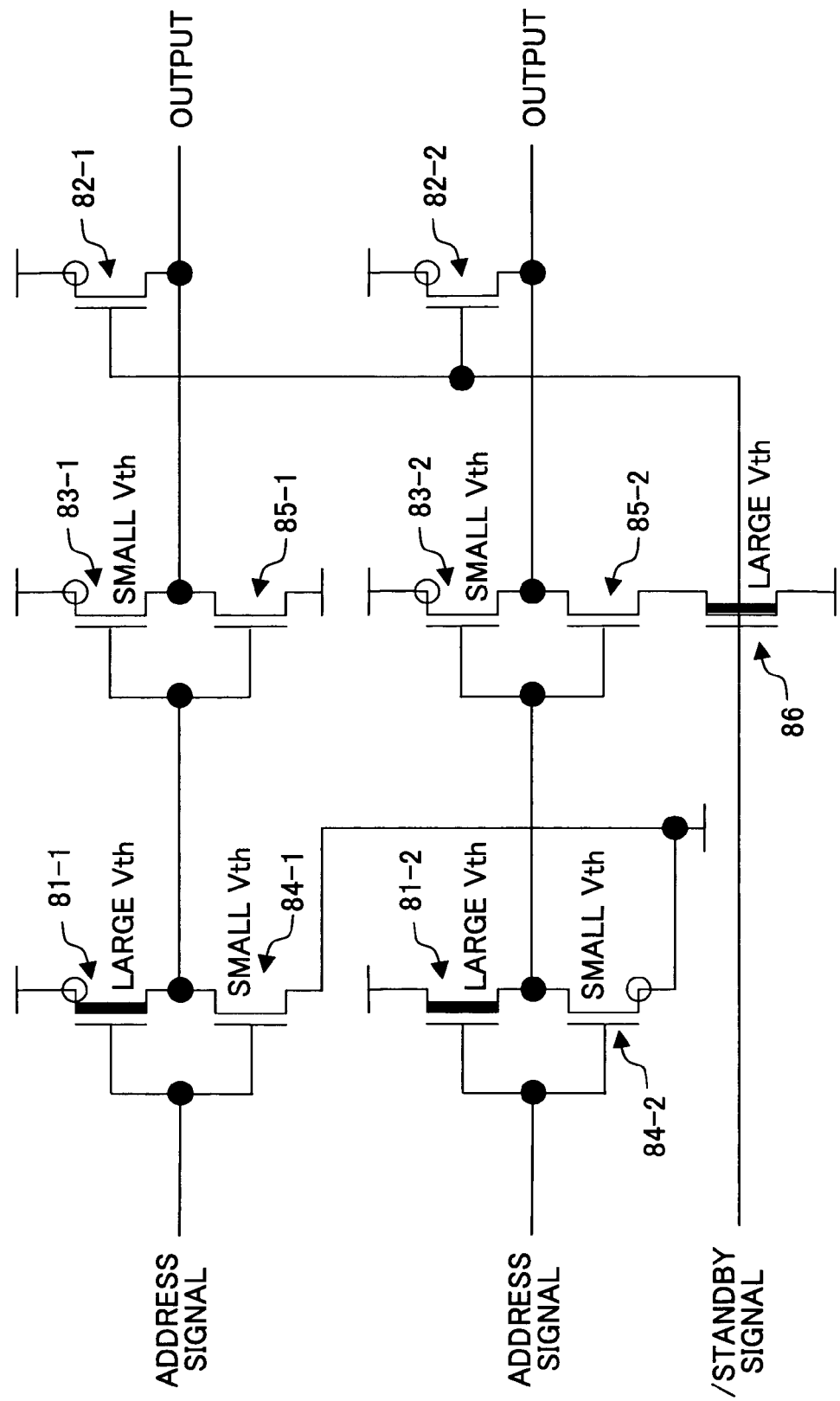
FIG. 7 is a circuit diagram showing a third embodiment of the decoder switch circuit.

FIG. 7 is a circuit diagram showing a third embodiment of the decoder switch circuit. The decoder switch circuit of FIG. 7 includes PMOS transistors 81-1 through 83-1, NMOS transistors 84-1 and 85-1, PMOS transistors 81-2 through 83-2, NMOS transistors 84-2 and 85-2, and an NMOS transistor 86.

A portion comprised of the PMOS transistors 81-1 through 83-1, the NMOS transistors 84-1 and 85-1, and the NMOS transistor 86 corresponds to a single decoder switch circuit, and has the same construction as the decoder switch circuit shown in FIG. 6. A portion comprised of the PMOS transistors 81-2 through 83-2, the NMOS transistors 84-2 and 85-2, and the NMOS transistor 86 corresponds to a single decoder switch circuit, and has the same construction as the decoder switch circuit shown in FIG. 6. In this manner, a plurality of decoder switch circuits share the NMOS transistor 86, thereby achieving reduction in circuit size. FIG. 7 illustrates a configuration in which the two decoder switch circuits share the NMOS transistor 86. Alternatively, a configuration may be such that three or more decoder switch circuits share the NMOS transistor 86. It should be noted that the operation of the decoder switch circuit is the same as that described in connection with FIG. 6, and a description thereof will be omitted.

Figure 8:
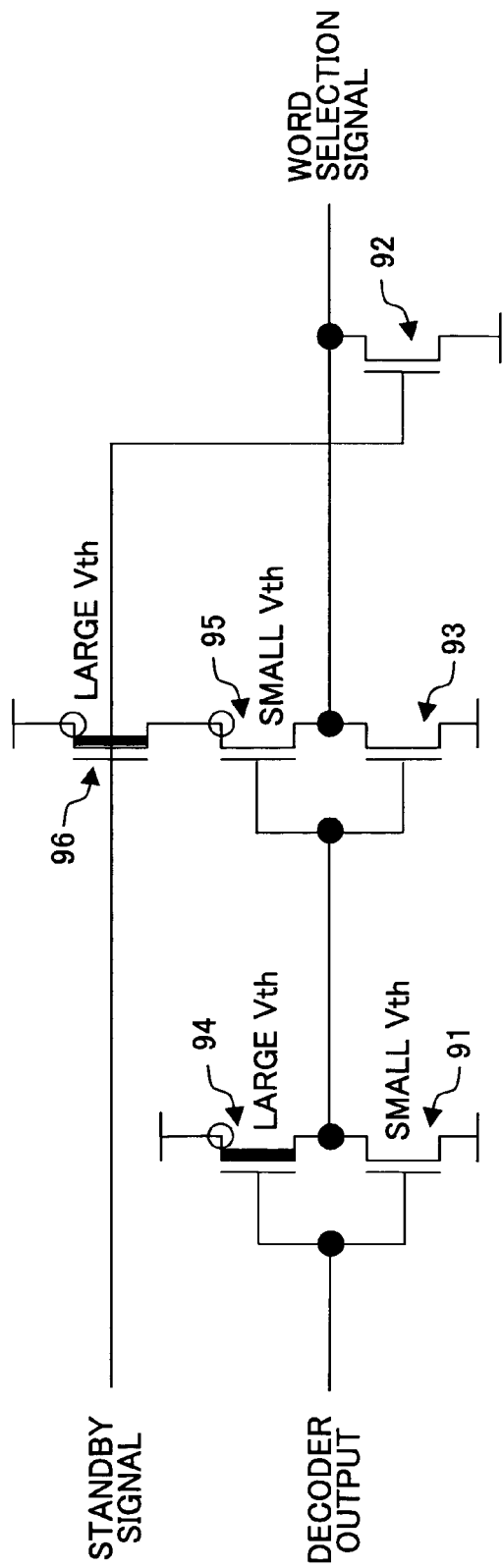
FIG. 8 is a circuit diagram showing a second embodiment of the WL switch circuit.

FIG. 8 is a circuit diagram showing a second embodiment of the WL switch circuit. The WL switch circuit of FIG. 6 includes NMOS transistors 91 through 93 and PMOS transistors 94 through 96.

The NMOS transistor 91 and the PMOS transistor 94 constitute a first-stage inverter, and the NMOS transistor 93 and the PMOS transistor 95 constitute a second-stage inverter. When the standby signal is LOW indicating a normal read/write operation, the NMOS transistor 92 becomes nonconductive, and the PMOS transistor 96 becomes conductive. As a result, the decoder output passes through the first-stage inverter and the second-stage inverter to be output as a word selection signal. An operation for selective activation of a word line in response to the word selection signal is thus properly performed. When the standby signal is HIGH indicating an unselected state corresponding to a standby state, the NMOS transistor 92 becomes conductive, and the PMOS transistor 96 becomes nonconductive. As a result, the word-line selection signal is set to LOW, thereby putting all the word lines in a deactivated state to provide a proper standby condition.

In this configuration, the NMOS transistor 91 and the PMOS transistor 95 are designed to have a small threshold value in order to speed up signal transmission when a HIGH decoder output is input. In the case in which a LOW decoder output is input, this circuit portion does not affect the selective activation of a word line corresponding to the specified address. There is thus no need to take into account the speed of signal transmission. Accordingly, the PMOS transistor 94 which becomes conductive by responding to a LOW decoder output is designed to have a large threshold value so as to suppress an excessive leak current. Moreover, the threshold of the PMOS transistor 96 is also set to a large value, thereby to suppress an excessive leak current.

Figure 9:
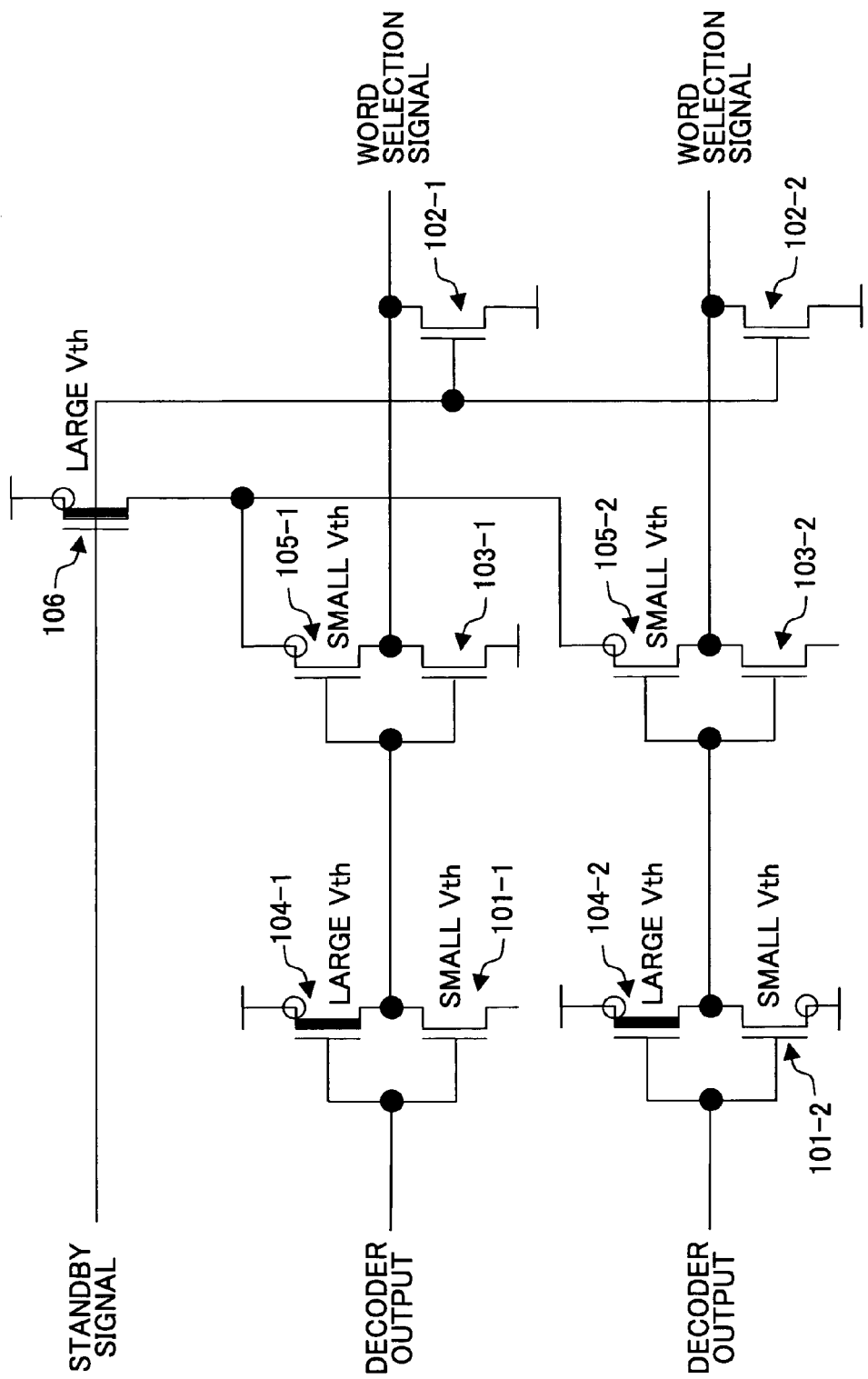
FIG. 9 is a circuit diagram showing a third embodiment of the WL switch circuit.

FIG. 9 is a circuit diagram showing a third embodiment of the WL switch circuit. The WL switch circuit of FIG. 9 includes NMOS transistors 101-1 through 103-1, PMOS transistors 104-1 and 105-1, NMOS transistors 101-2 through 103-2, PMOS transistors 104-2 and 105-2, and a PMOS transistor 106.

A portion comprised of the NMOS transistors 101-1 through 103-1, the PMOS transistors 104-1 and 105-1, and the PMOS transistor 106 corresponds to a single WL switch circuit, and has the same construction as the WL switch circuit shown in FIG. 8. Moreover, a portion comprised of the NMOS transistors 101-2 through 103-2, the PMOS transistors 104-2 and 105-2, and the PMOS transistor 106 corresponds to a single WL switch circuit, and has the same construction as the WL switch circuit shown in FIG. 8. In this manner, a plurality of WL switch circuits share the PMOS transistor 106, thereby achieving reduction in circuit size. FIG. 9 illustrates a configuration in which the two WL switch circuits share the PMOS transistor 106. Alternatively, a configuration may be such that three or more WL switch circuits share the PMOS transistor 106. It should be noted that the operation of the WL switch circuit is the same as that described in connection with FIG. 8, and a description thereof will be omitted.

In the embodiments described above, the transistors for high speed operation are referred to as transistors having a small threshold value, and the transistors for low speed operation (for small leak currents) are referred to as transistors having a large threshold value. Alternatively, the transistors for high speed operation may be characterized as transistors having a short gate length and/or a wide gate width, and the transistors for low speed operation (for small leak currents) may be characterized as transistors having a long gate length and/or a narrow gate width. Although the size of a threshold value is generally controlled by process conditions, transistors for the high speed purpose and transistors for the low speed purpose may be discriminated by the size of the transistors.

Further, the present invention is not limited to these embodiments, but various variations and modifications may be made without departing from the scope of the present invention.

What is claimed is:

1. A semiconductor memory device, comprising:
    a memory cell array;
    a decoder circuit configured to assert a decoding signal for selecting an access position in said memory cell array in response to an address signal supplied from an exterior;
    a first circuit configured to put all of the decoding signals of said decoder circuit in an asserted state regardless of a value of the address signal in response to assertion of a standby signal supplied from the exterior; wherein said decoder includes a first transistor; and a second transistor configured to operate faster than said first transistor.

2. The semiconductor memory device as claimed in claim 1, wherein said decoder circuit is a row decoder circuit configured to select a row address of the access position in said memory cell array.

3. The semiconductor memory device as claimed in claim 1, wherein said decoder circuit is a column decoder circuit configured to select a column address of the access position in said memory cell array.

4. The semiconductor memory device as claimed in claim 1, wherein the standby signal indicates a standby state in which no access is made to said memory cell array.

5. The semiconductor memory device as claimed in claim 1, wherein said first circuit is situated at a stage where inputs are given to a decoding process performed by said decoder circuit.

6. The semiconductor memory device as claimed in claim 1, wherein said second transistor is coupled to an output node from which the decoding signal is output, and becomes conductive to assert the decoding signal, and wherein said first transistor is coupled to the output node, and becomes nonconductive to assert the decoding signal.

7. The semiconductor memory device as claimed in claim 6, wherein said first transistor has a first threshold value, and said second transistor has a second threshold value smaller than the first threshold value.

8. The semiconductor memory device as claimed in claim 6, wherein said decoder circuit includes:

a logic circuit configured to decode the address signal; and a drive circuit configured to output the decoding signal in response to an output of said logic circuit, wherein said first transistor and said second transistor constitute a portion of said drive circuit.

9. A semiconductor memory device comprising:

a memory cell array;

a decoder circuit configured to assert a decoding signal for selecting an access position in said memory cell array in response to an address signal supplied from an exterior;

a first circuit configured to put all of the decoding signals of said decoder circuit in an asserted state regardless of a value of the address signal in response to assertion of a standby signal supplied from the exterior; and a second circuit configured to activate a selection line corresponding to the access position in said memory cell array in response to assertion of the decoding signal of said decoder circuit if the standby signal is negated, and configured to deactivate the selection line regardless of a value of the decoding signal of said decoder circuit in response to the assertion of the standby signal.

* * * * *